(12) United States Patent
Tigelaar (10) Patent No.: US 7,410,841 B2
(45) Date of Patent: Aug. 12, 2008

(54) BUILDING FULLY-DEPLETED AND PARTIALLY-DEPLETED TRANSISTORS ON SAME CHIP

(75) Inventor: Howard Lee Tigelaar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 280 days.

(21) Appl. No.: 11/091,249

(22) Filed: Mar. 28, 2005

(65) Prior Publication Data

US 2006/0216898 A1    Sep. 28, 2006

(51) Int. Cl.
*H01L 21/84* (2006.01)
(52) U.S. Cl. ............... 438/153; 438/977; 257/E21.704
(58) Field of Classification Search ............ 438/153, 438/155, 977; 257/E21.704
See application file for complete search history.

(56) References Cited

U.S. PATENT DOCUMENTS

| 6,222,234 | B1* | 4/2001 | Imai .................... 257/347 |
| 6,537,891 | B1 | 3/2003 | Dennison et al. |
| 2004/0180478 | A1 | 9/2004 | Yang et al. |
| 2004/0217420 | A1 | 11/2004 | Yeo et al. |
| 2004/0217775 | A1 | 11/2004 | Turner |

OTHER PUBLICATIONS

U.S. Appl. No. 11/091/078, filed Mar. 28, 2005, Tigelaar.

* cited by examiner

*Primary Examiner*—Chandra Chaudhari
(74) *Attorney, Agent, or Firm*—Frederick J. Telecky, Jr.; Wade J. Brady, III (57) ABSTRACT

A method (10) of forming fully-depleted silicon-on-insulator (FD-SOI) transistors (150) and partially-depleted silicon-on-insulator (FD-SOI) transistors (152) on a semiconductor substrate (104) as part of an integrated circuit fabrication process is disclosed.

21 Claims, 7 Drawing Sheets

BUILDING FULLY-DEPLETED AND PARTIALLY-DEPLETED TRANSISTORS ON SAME CHIP

FIELD OF INVENTION

The present invention relates generally to semiconductor devices and more particularly to fabricating fully-depleted and partially-depleted SOI devices in an integrated circuit fabrication process.

BACKGROUND OF THE INVENTION

Semiconductor device geometries have dramatically decreased in size since such devices were first introduced several decades ago. The desire for higher performance circuits has driven the development of high-speed sub-100 nanometer (nm) silicon-on-insulator (SOI) complementary metal-oxide-semiconductor (CMOS) technology. In SOI technology, metal-oxide semiconductor field-effect transistors (MOSFETs) are formed on a thin layer of silicon overlying a layer of insulating material such as silicon oxide. Devices formed on SOI offer many advantages over their bulk counterparts. For example, SOI devices generally have a reduced junction capacitance, little to no reverse body effect, soft-error immunity, full dielectric isolation, and little to no latch-up. SOI technology therefore enables higher speed performance, higher packing density, and reduced power consumption.

There are two types of conventional SOI devices: partially-depleted SOI (PD-SOI) devices, and fully-depleted (FD-SOI) devices. A conventional PD-SOI transistor device is one in which the body thickness is thicker than the maximum depletion layer width in the silicon during device operation, and a conventional FD-SOI transistor device is one in which the body thickness is thinner than the maximum depletion layer width in the silicon during device operation. Consequently, during operation, the PD-SOI device experiences a "partial" depletion of the silicon body, while the FD-SOI experiences a "full" depletion thereof. The conventional PD-SOI and FD-SOI devices are planar devices and thus are formed in the plane of the wafer.

Each of the PD-SOI and FD-SOI devices have their own respective advantages and disadvantages. For example, while PD-SOI devices have the merit of being highly manufacturable, significant design burdens are experienced due to floating body effects associated therewith. More particularly, in PD-SOI devices, charge carriers generated by impact ionization near one source/drain region may accumulate in the floating body beneath a channel of the transistor. When sufficient carriers accumulate in the floating body, the body potential is effectively altered.

Floating body effects occur in PD-SOI devices because of charge build-up in the floating body region. Such floating body effects can result in kinks in current-voltage (I-V) curves of the device, thereby degrading the electrical performance of a circuit. In general, the body potential of a PD-SOI device may vary during static, dynamic, or transient device operation, and is a function of many factors like temperature, voltage, circuit topology, and switching history. Therefore, circuit design using PD-SOI devices must take such factors into account, and accordingly there are certain circuit applications where the floating body effects represent a significant barrier for the adoption of PD-SOI technology.

Another way of avoiding floating body effects in SOI devices is to adopt a fully-depleted SOI (FD-SOI) technology. FD-SOI devices do not suffer from floating-body effects due to the fact that the body is fully-depleted during device operation. FD-SOI technology is therefore relatively design-friendly with respect to floating-body effects. FD-SOI devices are also believed to provide better junction capacitance, lower off-state leakage, fewer soft errors, lower operating voltages and lower gate delay than PD-SOI devices.

Traditionally, in a FD-SOI technology, devices with a low body-doping and/or a thin body thickness are used. Additionally, for good control of short-channel effects, the device body thickness is usually reduced to less than one third of the gate length. This presents its own set of problems, however, as SOI substrates with uniform ultra-thin Si films, as required for the manufacture of FD-SOI devices with ultra-thin body, are difficult to obtain or fabricate and non-uniformities in the Si film thickness may result in significant fluctuations in the device characteristics and negatively impact the ease of manufacture. In addition, it is difficult to build analog transistors, high voltage I/O transistors, or transistors with different Vt's on the same chip as high performance FD-SOI transistors. These types of transistors are more readily built with PD-SOI transistors.

Consequently, it would be desirable to be able to reliably form both PD-SOI and FD-SOI transistor devices on a single semiconductor substrate as part of an integrated circuit fabrication process, wherein either device can be employed based on circuit application requirements.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming fully-depleted silicon-on-insulator (FD-SOI) and partially-depleted silicon-on-insulator (PD-SOI) transistor devices as part of an integrated circuit fabrication process. Forming the different types of transistors on the same semiconductor substrate allows different circuit application requirements to be met. For example, FD-SOI transistors can be used where speed and low threshold voltages (Vt's) are important. Likewise, PD-SOI transistors can be used where low off current is important, where high voltage I/O transistors are needed, where analog transistors are needed, where dynamic Vsub modulation is desired, and/or where multiple transistors having different Vt's are needed. Capacitors can also be built from a layer of polysilicon and the substrate, among other things. Similarly, bipolar transistors can also be fabricated.

According to one or more aspects of the present invention, a method of forming a fully-depleted silicon-on-insulator (FD-SOI) transistor and a partially-depleted silicon-on-insulator (PD-SOI) transistor as part of an integrated circuit fabrication process is disclosed. The method includes providing a silicon-on-insulator (SOI) substrate which comprises a layer of silicon material formed over a layer of insulating material which is in turn formed over a semiconductor substrate. The layer of silicon material is initially thinned to a thickness suitable for forming a partially-depleted transistor by growing a first grown layer of oxide material over the layer of silicon material, where growing the first grown layer of oxide material thins the layer of silicon material by consuming silicon as part of the growth process. A layer of nitride material is then formed over the first grown layer of oxide material. The layer of nitride material, the first grown layer of oxide material and the layer of silicon material are patterned (e.g., etched) to establish trenches therein for isolation regions. A layer of dielectric material is deposited to fill in the trenches, and this layer of dielectric material is planarized. An area of the SOI substrate wherein the partially-depleted transistor is to be formed is masked off and the layer of nitride material is removed from the area where the fully-depleted transistor is to be formed. The first grown layer of oxide material is removed in the area where fully-depleted transistor is to be formed. The mask is then removed in the area of the SOI substrate where the partially-depleted transistor is to be formed. The layer of silicon material in the area where the fully-depleted transistor is to be formed is thinned to a thickness suitable for forming the fully-depleted transistor by growing a second grown layer of oxide material over the layer of silicon material, where growing the second grown layer of oxide material thins the layer of silicon material by consuming silicon as part of the growth process. The layer of nitride material is then removed from the area where the partially-depleted transistor is to be formed. The first grown layer of oxide material is removed in the area where the partially-depleted transistor is to be formed and the second grown layer of oxide material is removed in the area where the fully-depleted transistor is to be formed. Subsequently, the partially-depleted transistor is formed in the area where the partially-depleted transistor is to be formed and the fully-depleted transistor is formed in the area where the fully-depleted transistor is to be formed.

According to one or more other aspects of the present invention, an integrated circuit is disclosed that includes a fully-depleted transistor and a partially-depleted transistor formed on a single semiconductor substrate. The fully-depleted and partially-depleted transistors are formed as part of an integrated circuit fabrication process, where the fully-depleted transistor is formed within a silicon-on-insulator (SOI) region of the semiconductor substrate that has been thinned more than a silicon-on-insulator (SOI) region of the semiconductor substrate wherein the partially-depleted transistor is formed.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. It will be appreciated that where like acts, events, elements, layers, structures, etc. are reproduced, subsequent (redundant) discussions of the same may be omitted for the sake of brevity. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Figure 1:
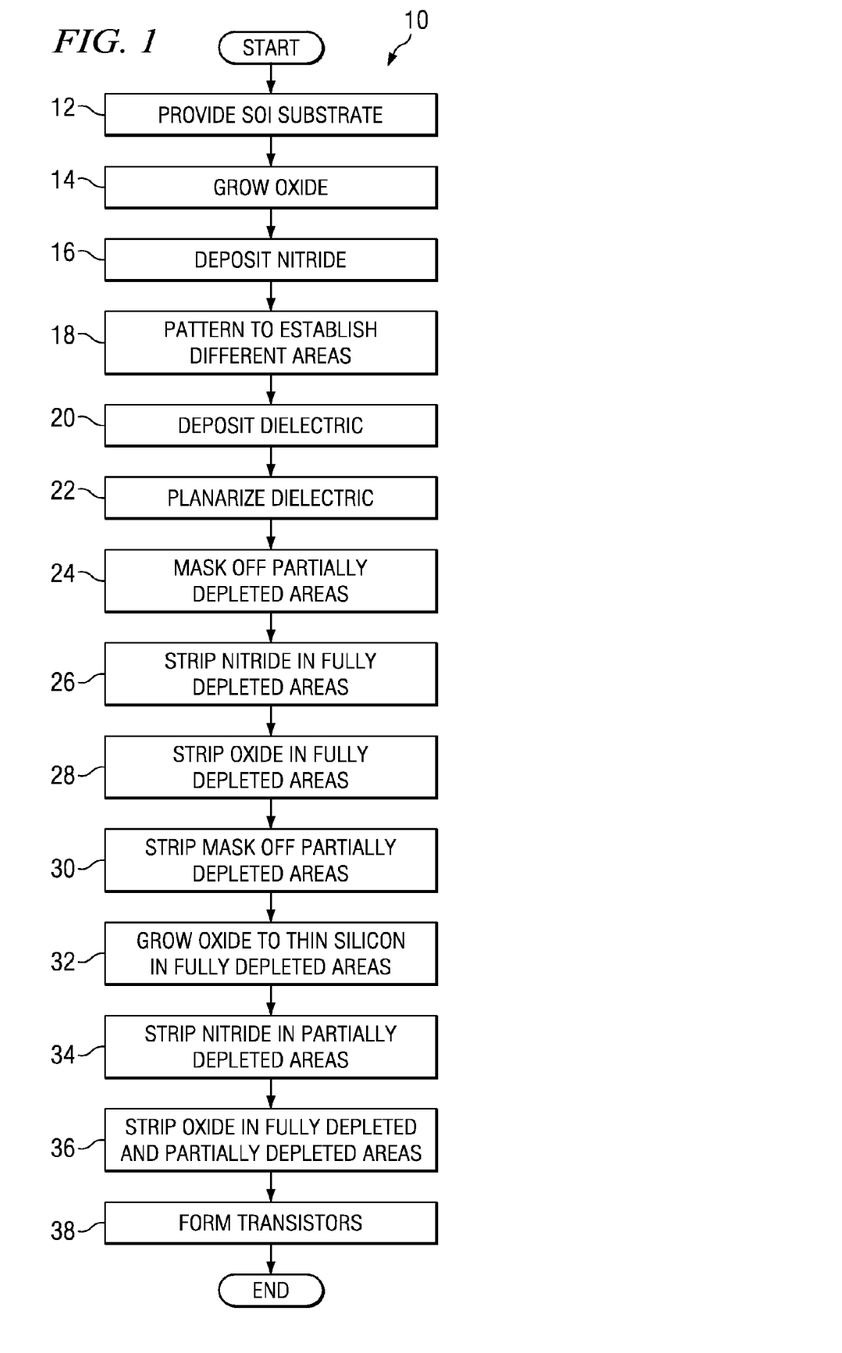
FIG. 1 is a flow diagram illustrating an exemplary method for forming fully-depleted silicon-on-insulator (FD-SOI) and partially-depleted silicon-on-insulator (FD-SOI) transistor devices in an integrated circuit fabrication process according to one or more aspects of the present invention.

Turning to FIG. 1, an exemplary methodology 10 is illustrated for forming fully-depleted silicon-on-insulator (FD-SOI) and partially-depleted silicon-on-insulator (FD-SOI) transistor devices in an integrated circuit fabrication process according to one or more aspects of the present invention. Although the methodology 10 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

Figure 2:
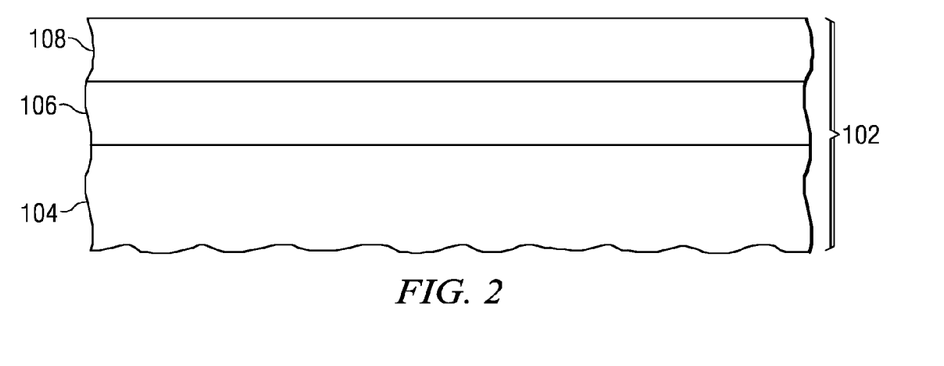
FIGS. 2-15 are fragmentary cross sectional diagrams illustrating the formation of exemplary fully-depleted silicon-on-insulator (FD-SOI) and partially-depleted silicon-on-insulator (FD-SOI) transistor devices in an integrated circuit fabrication process according to one or more aspects of the present invention, such as the methodology set forth in FIG. 1.

The method 10 begins at 12, wherein a SOI starting material 102 is provided (FIG. 2). The SOI starting material comprises a semiconductor substrate 104 over which a layer of nonconductive insulating material 106 is formed, and having a thin layer of silicon 108 formed over the layer of insulating material 106 (FIG. 2). The layer of insulating material 106 may comprise a buried oxide layer (BOX), for example. Similarly, the semiconductor substrate 104 may comprise any type of semiconductor body (e.g., formed of silicon or SiGe) such as a semiconductor wafer or one or more die on a wafer, as well as any other type of semiconductor layers associated therewith. By way of example, the layer of silicon 108 can have a thickness of between around 800 Angstroms and around 1200 Angstroms.

Figure 3:
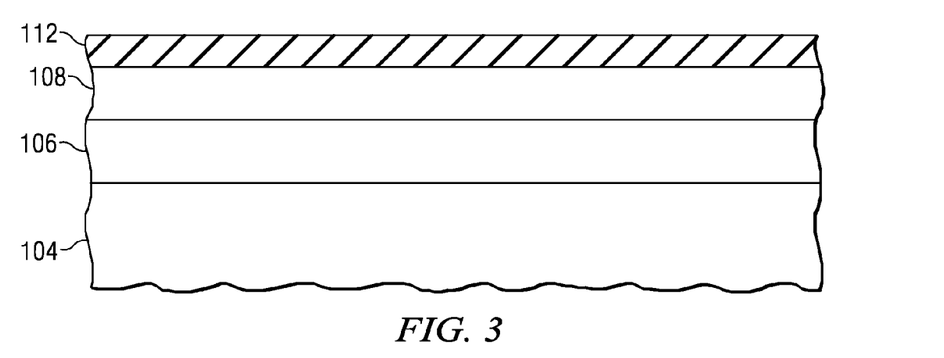

At 14, a first grown layer of oxide based material 112 is grown over the layer of silicon 108 (FIG. 3). As the first grown layer of oxide material 112 grows, some of the layer of silicon material 108 is consumed as part of the growth process. In this manner, growing the layer of oxide material 112 reduces the thickness of the layer of silicon 108 (particularly after the first grown layer of oxide material 112 is subsequently removed). By way of example, the first grown layer of oxide material 112 can be formed to a thickness of around 200 Angstroms or less so that the layer of silicon material is thinned to a thickness of between around 800 Angstrom and around 1000 Angstroms. In any event, the layer of silicon material 112 has a resultant thickness suitable for forming a partially-depleted transistor therein.

Figure 4:
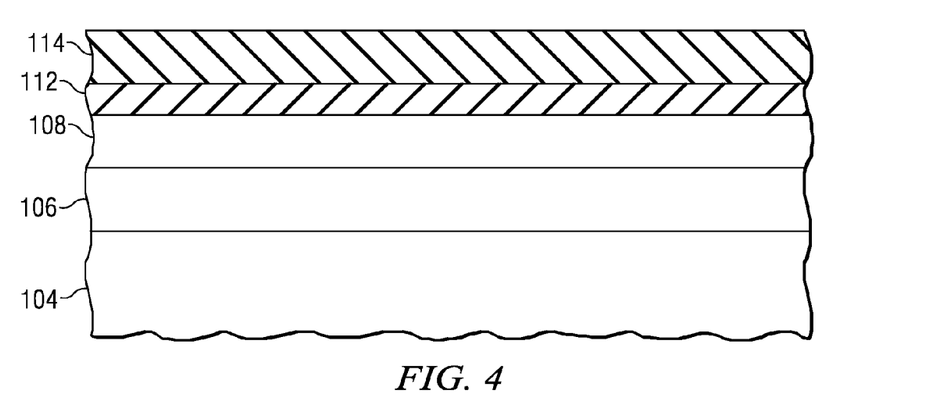
Figure 5:
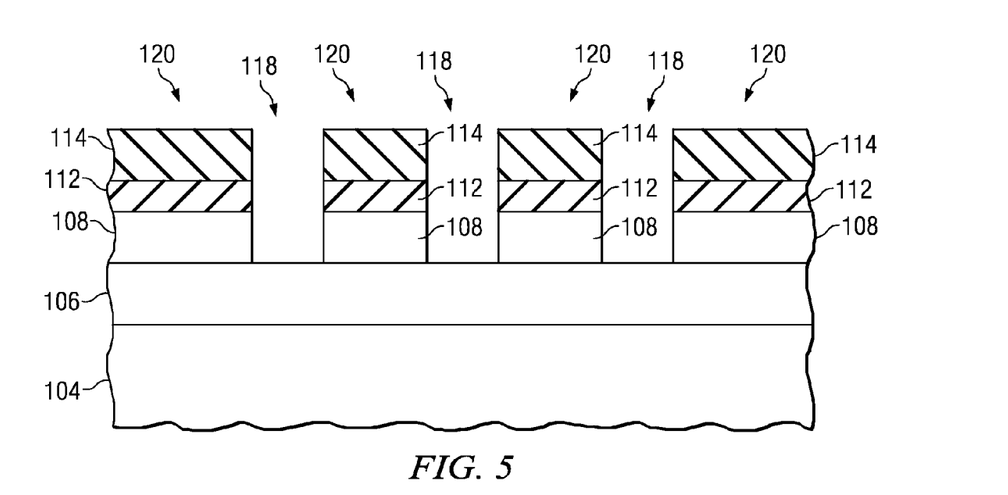

A layer of nitride based material 114 is then deposited over the layer oxide 112 at 16 (FIG. 4). The layer of nitride material 114 can be formed to thickness of between around 700 Angstroms and around 800 Angstroms, for example. The layer of nitride material 114, first grown layer of oxide material 112 and layer of silicon 108 are then patterned at 18 and etched away to form trenches 118 therein. The trenches isolate different 'active' areas or regions 120 within the SOI substrate wherein (after subsequent treatment) different devices can be formed, such as fully-depleted or partially-depleted transistors (FIG. 5). It will be appreciated that while three trenches 118 and four active regions are depicted in the illustrated example, that any suitable number of such areas can be formed according to one or more aspects of the present invention.

The patterning at 16 can be performed in any suitable manner, such as with lithographic techniques, for example, where lithography broadly refers to processes for transferring one or more patterns between various media. In lithography, a light sensitive resist coating (not shown) is formed over one or more layers to which a pattern is to be transferred (e.g., layers 114, 112, 108). The resist coating is then patterned by exposing it to one or more types of radiation or light which (selectively) passes through an intervening lithography mask containing the pattern. The light causes the exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched) to transfer the pattern thereto.

Figure 6:
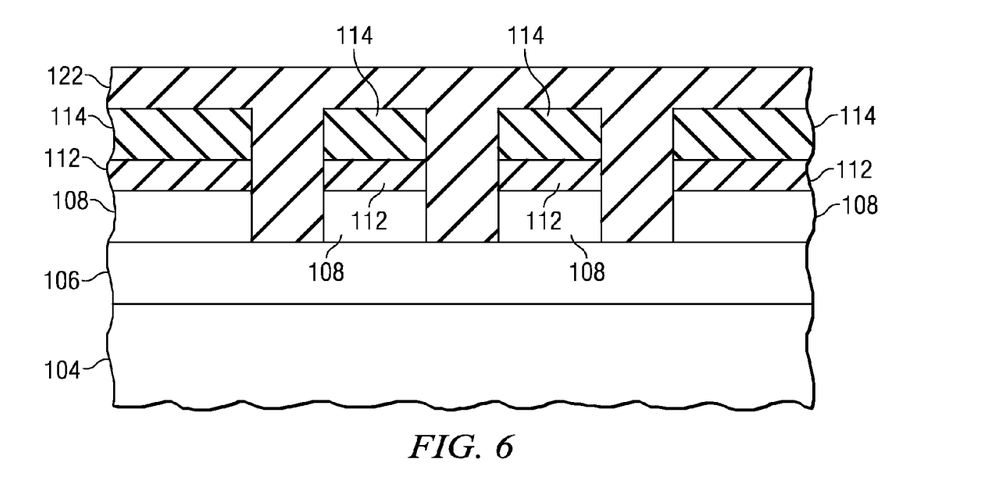
Figure 7:
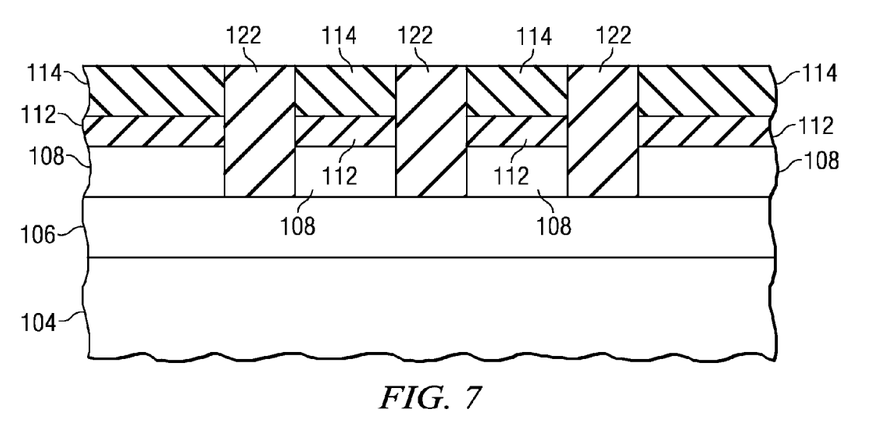

A layer of dielectric material 122, such as an oxide based material, for example, is then deposited at 20 (FIG. 6). This material 120 fills in the trenches 118 between the different active regions 120 and electrically isolates the active regions (and thus devices formed therein) from one another. It will be appreciated that the layer of dielectric material 122 is preferably deposited rather than grown so that the silicon material 108 is not consumed as this layer is formed. The layer of dielectric material 122 can be formed by a chemical vapor deposition process, for example, such as high pressure chemical vapor deposition (HPCVD). A planarizing activity is then performed at 22, such as a chemical mechanical polishing (CMP), for example, to remove excess material 122 and planarize the layer of dielectric material 122 (FIG. 7). It will be appreciated that the layer of nitride material 114 can serve as a stopping layer for a CMP process.

Figure 8:
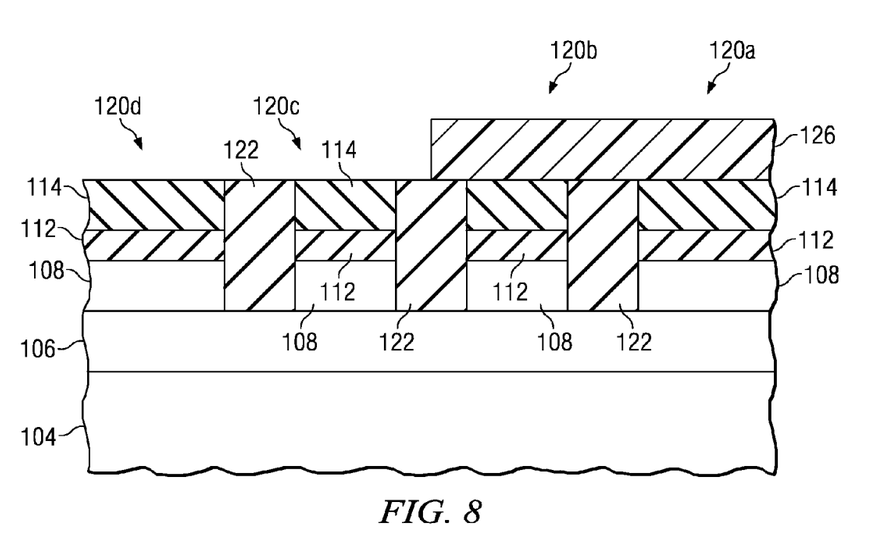
Figure 9:
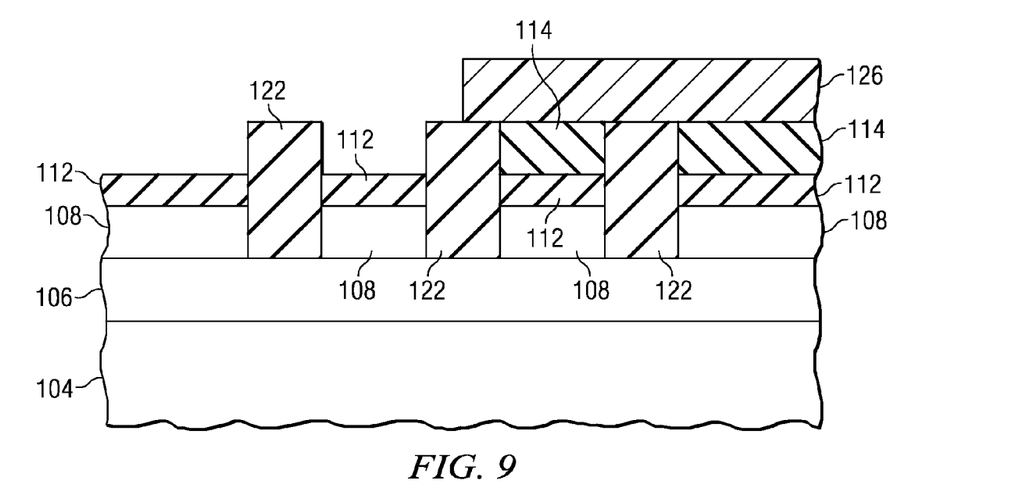

Active areas where partially-depleted transistors are to be formed are then covered at 24 with a layer of masking material 126, such as a resist, for example (FIG. 8). It will be appreciated that while two active areas 120a, 120b are depicted as being masked off and two active areas 120c, 120d are not masked off in the illustrated example, that any suitable number of areas can be masked off (or not) according to one or more aspects of the present invention. At 26, the layer of nitride material 114 is removed from the active areas 120c, 120d where fully-depleted transistors are to be formed (FIG. 9). A plasma etch, for example, can be used to remove the layer of nitride material 114.

Figure 10:
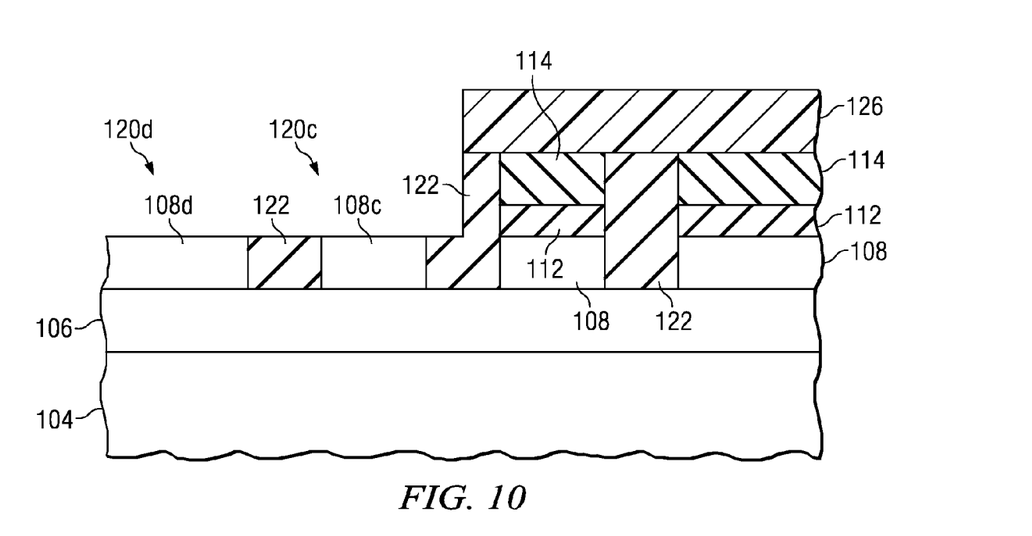
Figure 11:
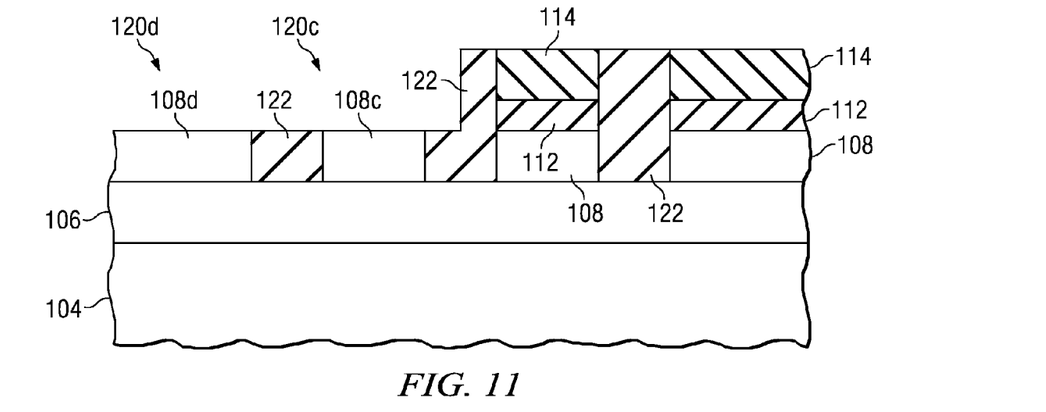

At 28, the first grown layer of oxide material 112 is then removed from the active areas 120c, 120d, such as by stripping or etching this layer of material with a hydrogen fluoride (HF) based agent, for example (FIG. 10). It will be appreciated that since the deposited layer of material 122 is formed from the same or a similar dielectric material, that excess (unmasked) amounts of this layer 122 between the active regions are removed as well at 28. The layer of masking material 126 formed at 24 is then removed from the partially depleted transistor areas at 30 (FIG. 11). It is to be appreciated, however, that the layer of masking material 126 could be removed before the first grown layer of oxide material 112 is removed.

Figure 12:
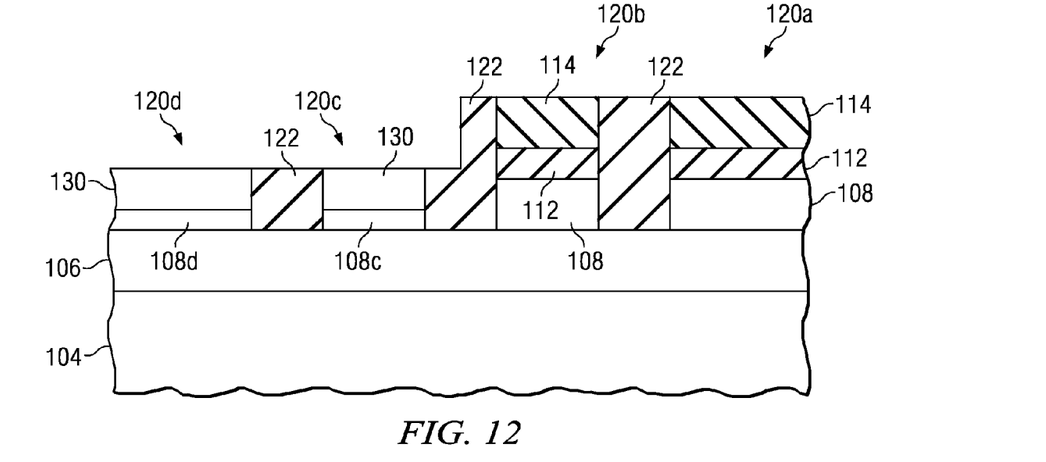

At 32, a second grown layer of oxide material 130 is grown over the areas 120c, 120d of SOI where the fully-depleted transistors are to be formed (FIG. 12). Growing the second grown layer of oxide material 130 consumes some of the silicon 108c, 108d in areas 120c, 120d as part of the oxide growth process. Accordingly, growing the second grown layer of oxide material 130 further thins the silicon material 108c, 108d in areas 120c, 120d (particularly after the second grown layer of oxide material 130 is subsequently removed). By way of example, the second grown layer of oxide material 130 can thin the layer of silicon material 108 in areas 120c, 120d down to a thickness of between around 50 Angstroms and around 200 Angstroms. In any event, the areas of silicon material 108c, 108d in areas 120c, 120d have a resultant thickness suitable for forming a fully-depleted transistor therein. It will be appreciated that the nitride material 114 remaining on regions 120a, 20b prevents the second grown layer of oxide material 130 from growing there-over.

Figure 13:
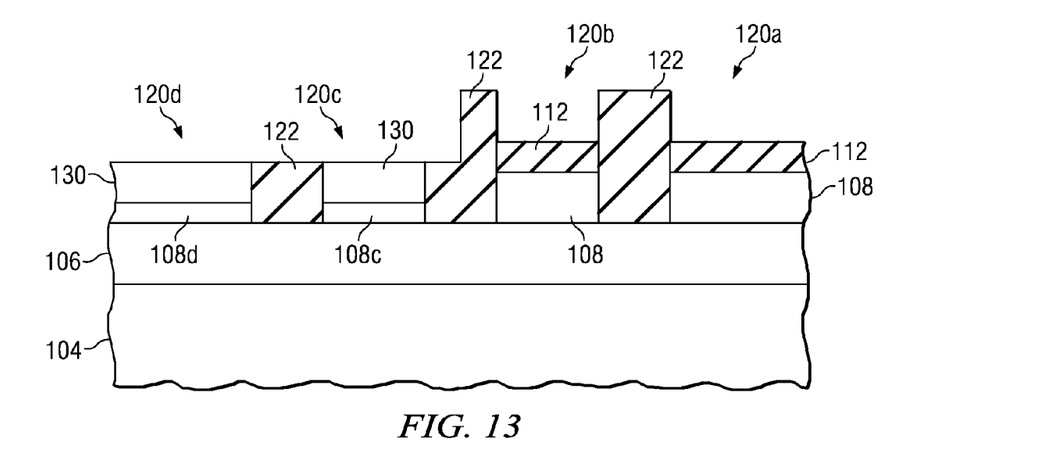
Figure 14:
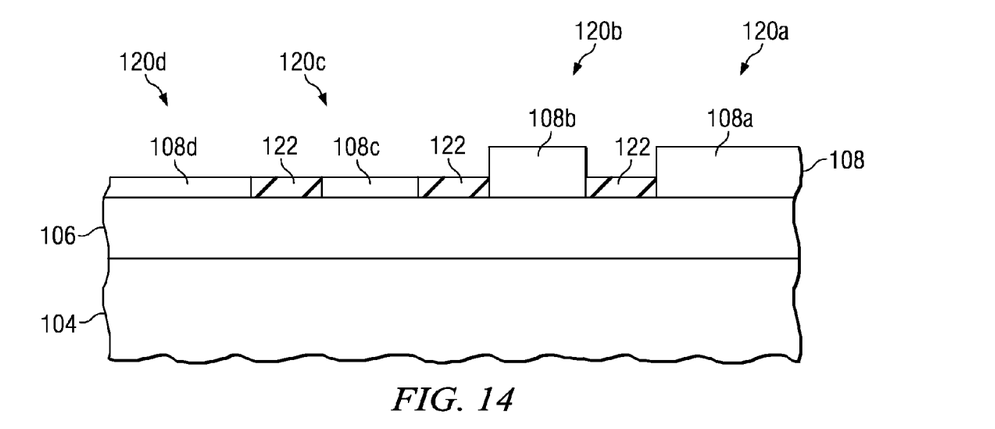

At 34, the layer of nitride material 114 is removed from the active areas 120a, 120b where partially-depleted transistors are to be formed (FIG. 13). A hot phosphoric acid solution and/or plasma etch, for example, can be used to remove the layer of nitride material 114. The first grown layer of oxide material 112 and the second grown layer of oxide material 130 are then removed at 36 from the active areas 120a, 120b and 120c, 120d, respectively, such as by using a hydrogen fluoride (HF) based solution, for example, to strip the layers 112 and 130 (FIG. 14). It will be appreciated that since the deposited layer of material 122 is formed from the same or a similar dielectric material, that excess (unmasked) amounts of this layer 122 between the active regions are removed as well at 36. As such, the different portions of silicon 108a, 108b and 108c, 108d, which have different thicknesses, are exposed in the active areas 120a, 120b and 120c, 120d, respectively, wherein the partially-depleted and fully-depleted transistors are to be formed, respectively.

Figure 15:
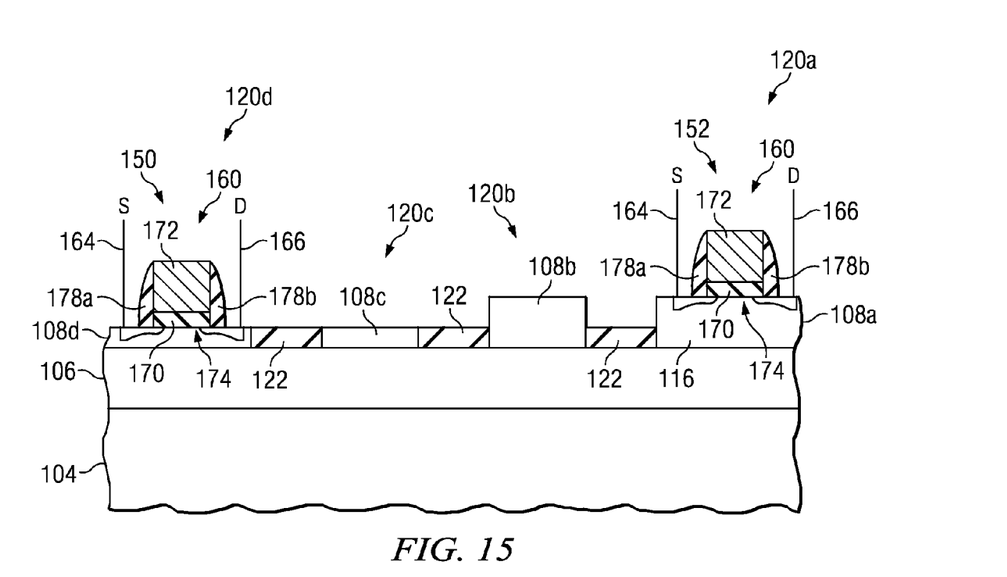

Accordingly, at 38 the different transistors can be formed in the different regions (FIG. 15). More particularly, fully-depleted silicon-on-insulator (FD-SOI) transistors can be formed in the regions 120c, 120d comprising the further thinned silicon 108c, 108d, while the partially-depleted silicon-on-insulator (PD-SOI) transistors can be formed in the regions 120a, 120b comprising the thinned silicon 108a, 108b. It will be appreciated that while two thinned silicon regions 108a, 108b and two further thinned silicon regions 108c, 108d are depicted in the example illustrated, that any suitable number of such regions can be fashioned upon a semiconductor substrate according to one or more aspects of the present invention. Similarly, while in the example presented only one FD-SOI transistor 150 is illustrated in the further thinned silicon region 108d and only one PD-SOI transistor 152 is illustrated in the thinned silicon region 108a, any suitable number of transistors can be in the formed in the different regions 108a, 108b, 108c, 108d. The different transistors can be formed by slightly varying certain fabrication processes and/or selectively exposing different parts of the regions to different processes. For example, certain parts of the thinned regions 108a, 108b can be selectively masked off to receive more or less of one or more types of dopant materials.

Generally speaking, to establish any of the different transistors, a gate structure 160 and source and drain regions 164, 166 are formed (FIG. 15), after which silicide, metallization, and/or other back-end processing (not shown) can be performed. To form the gate structure 160, a thin gate oxide 170 is formed over the upper surface of the silicon regions. The gate oxide 170 can be formed by any suitable material formation process, such as thermal oxidation processing, for example. By way of example, the oxide layer 170 can, for example, be formed to a thickness of between about 20 Angstroms and about 500 Angstroms at a temperature of between about 800 degrees Celsius and about 1000 degrees Celsius in the presence of $O_2$. This layer of oxide material 170 can serve as a gate oxide in a high voltage CMOS transistor device, for example. Alternatively, a layer of oxide material 170 having a thickness of about 70 Angstroms or less can be formed to serve as a gate oxide in a low voltage CMOS transistor device, for example.

A gate layer 172 (e.g., of polysilicon or other conductive material) is then deposited over the layer of gate oxide material 170. The polysilicon layer 172 can, for example, for formed to between about 1000 to about 5000 Angstroms, and may include a dopant, such as a p-type dopant (Boron) or n-type dopant (e.g., Phosphorus), depending upon the type(s) of transistors to be formed. The dopant can be in the polysilicon 172 as originally applied, or may be subsequently added thereto (e.g., via a doping process). The gate oxide 170 and gate polysilicon 172 layers are then patterned to form the gate structure 160, which comprises a gate dielectric and a gate electrode, and which is situated over a channel region 174 in the silicon regions 108.

With the patterned gate structure formed, LDD, MDD, or other extension implants (not shown) can be performed, for example, depending upon the type(s) of transistors to be formed, and left and right sidewall spacers 178a, 178b can be formed along left and right lateral sidewalls of the patterned gate structure 160. Implants to form the source (S) region 164 and the drain (D) region 166 are then performed, wherein any suitable masks and implantation processes may be used in forming the source and drain regions 164, 166 to achieve desired transistor types. For example, a PMOS source/drain mask may be utilized to define one or more openings through which a p-type source/drain implant (e.g., Boron (B and/or $BF_2$)) is performed to form p-type source and drain regions for PMOS transistor devices. Similarly, an NMOS source/drain mask may be employed to define one or more openings through which an n-type source/drain implant (e.g., Phosphorous (P) and/or Arsenic (As)) is performed to form n-type source and drain regions for NMOS transistor devices. Depending upon the types of masking techniques employed, such implants may also selectively dope the polysilicon 172 of the gate structure 160 of certain transistors, as desired. It will be appreciated that the channel region 174 is thus defined between the source and drain regions 164, 166 in the different transistors. It will also be appreciated that the channel region 174 can be doped prior to forming the gate oxide 170 to adjust Vt's if desired.

Accordingly, forming transistors according to one or more aspects of the present invention allows fully-depleted silicon-on-insulator (FD-SOI) and partially-depleted silicon-on-insulator (PD-SOI) transistor devices to be fabricated in a single integrated circuit fabrication process. Forming the different types of transistors on the same semiconductor substrate allows their respective advantages to be integrated to satisfy different circuit application requirements. For example, FD-SOI transistors can be used where higher speed and lower threshold voltages (Vt's) are important. Likewise, PD-SOI transistors can be used where lower off current is important, where high voltage I/O transistors are desired, where transistors for dynamic Vsub modulation are desired and/or where multiple transistors having different Vt's are desired. Similarly, bipolar transistors can also be fabricated according to one or more aspects of the present invention.

It will be appreciated that while reference is made throughout this document to exemplary structures in discussing aspects of methodologies described herein (e.g., those structures presented in FIGS. 2-15 while discussing the methodology set forth in FIG. 1), that those methodologies are not to be limited by the corresponding structures presented. Rather, the methodologies (and structures) are to be considered independent of one another and able to stand alone and be practiced without regard to any of the particular aspects depicted in the Figs.

It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming a fully-depleted silicon-on-insulator (FD-SOI) transistor and a partially-depleted silicon-on-insulator (PD-SOI) transistor as part of an integrated circuit fabrication process, comprising:
   providing a silicon-on-insulator (SOI) substrate which comprises a layer of silicon material formed over a layer of insulating material which is formed over a semiconductor substrate;
   thinning the layer of silicon material to a thickness suitable for forming a partially-depleted transistor by growing a first grown layer of oxide material over the layer of silicon material, where growing the first grown layer of oxide material thins the layer of silicon material by consuming silicon as part of the growth process;
   forming a layer of nitride material over the first grown layer of oxide material;
   patterning the layer of nitride material, the first grown layer of oxide material and the layer of silicon material to establish trenches therein;

depositing a layer of dielectric material that fills in the trenches;
planarizing the deposited layer of dielectric material;
masking off an area of the SOI substrate wherein the partially-depleted transistor is to be formed;
removing the layer of nitride material in an area where the fully-depleted transistor is to be formed;
removing the first grown layer of oxide material in the area where fully-depleted transistor is to be formed;
unmasking the area of the SOI substrate where the partially-depleted transistor is to be formed;
thinning the layer of silicon material in the area where the fully-depleted transistor is to be formed to a thickness suitable for forming the fully-depleted transistor by growing a second grown layer of oxide material over the layer of silicon material, where growing the second grown layer of oxide material thins the layer of silicon material by consuming silicon as part of the growth process;
removing the layer of nitride material in the area where the partially-depleted transistor is to be formed;
removing the first grown layer of oxide material in the area where the partially-depleted transistor is to be formed and removing the second growth layer of oxide material in the area where the fully-depleted transistor is to be formed; and
forming the partially-depleted transistor in the area where the partially-depleted transistor is to be formed and forming the fully-depleted transistor in the area where the fully-depleted transistor is to be formed.

2. The method of claim 1, wherein the area where the partially-depleted transistor is to be formed is masked off with a resist material.

3. The method of claim 1, wherein the layer of silicon material in the area where the fully-depleted transistor is to be formed is thinned via etching rather than growing the second grown layer of oxide material.

4. The method of claim 1, wherein layer of dielectric material that fills in the trenches is deposited via chemical vapor deposition (CVD).

5. The method of claim 1, wherein the layer of silicon material is formed to a thickness of between around 800 Angstroms and around 1200 Angstroms.

6. The method of claim 1, wherein the layer of nitride material is formed to thickness of between around 700 Angstroms and around 800 Angstroms.

7. The method of claim 1, wherein the first grown layer of oxide material thins to layer of silicon material down to a thickness of between around 800 Angstrom and around 1000 Angstroms.

8. The method of claim 1, wherein the second grown layer of oxide material thins the layer of silicon material down to a thickness of between around 50 Angstroms and around 200 Angstroms.

9. The method of claim 1, wherein the deposited dielectric material is planarized via chemical mechanical polishing (CMP).

10. The method of claim 1, wherein at least one of:
a plasma etch is used to remove the layer of nitride material in the area where the fully-depleted transistor is to be formed,
a plasma etch is used to remove the layer of nitride material in the area where the partially-depleted transistor is to be formed,
a hydrogen fluoride (HF) based substance is used to remove the first grown layer of oxide material in the area where fully-depleted transistor is to be formed,
a hydrogen fluoride (HF) based substance is used to remove the first grown layer of oxide material in the area where the partially-depleted transistor is to be formed, and
a hydrogen fluoride (HF) based substance is used to remove the second grown layer of oxide material in the area where the fully-depleted transistor is to be formed.

11. The method of claim 1, wherein
forming the fully-depleted transistor comprises forming a fully-depleted gate structure over the thinned silicon in the area where the fully-depleted transistor is to be formed, forming a source region within the thinned silicon adjacent to one side of the fully-depleted gate structure and forming a drain region within the thinned silicon adjacent to the other side of the fully-depleted gate structure, and
forming the partially-depleted transistor comprises forming a partially-depleted gate structure over the thinned silicon in the area where the partially-depleted transistor is to be formed, forming a source region within the thinned silicon adjacent to one side of the partially-depleted gate structure and forming a drain region within the thinned silicon adjacent to the other side of the partially-depleted gate structure.

12. The method claim 11, wherein the fully-depleted gate structure comprises a gate dielectric and a gate electrode, and the partially-depleted gate structure comprises a gate dielectric and a gate electrode.

13. A method of forming a fully-depleted silicon-on-insulator (FD-SOI) transistor and a partially-depleted silicon-on-insulator (PD-SOI) transistor as part of an integrated circuit fabrication process, comprising:
providing a silicon-on-insulator (SOI) substrate which comprises a layer of silicon material formed over a layer of insulating material which is in turn formed over a semiconductor substrate;
converting at least some of the SOI substrate into an area where the partially-depleted transistor can be formed and converting at least some of the SOI substrate into an area where the fully-depleted transistor can be formed, wherein the converting comprises:
removing a portion of the layer of silicon material to form a trench therein which separates the area where the partially-depleted transistor can be formed from the area where the fully-depleted transistor can be formed;
forming an insulation material in the trench wherein the insulation material contacts an oxidation inhibitor layer which overlies the area where the partially-depleted transistor can be formed and the area where the fully-depleted transistor can be formed in the insulation material; and
forming the partially-depleted transistor in the area where the partially-depleted transistor can be formed and forming the fully-depleted transistor in the area where the fully-depleted transistor can be formed.

14. The method of claim 13, wherein converting at least some of the SOI substrate into an area where the partially-depleted transistor can be formed further comprises:
thinning the layer of silicon material to a thickness suitable for forming a partially-depleted transistor.

15. The method of claim 14, wherein converting at least some of the SOI substrate into an area where the fully-depleted transistor can be formed further comprises:

further thinning the layer of silicon material in the area where the fully-depleted transistor can be formed to a thickness suitable for forming a fully-depleted transistor.

16. The method of claim 15, wherein the layer of silicon material is thinned by growing a first grown layer of oxide material which consumes silicon as part of the growth process, and removing the first grown layer of oxide material to reveal the thinned silicon.

17. The method of claim 16, wherein the layer of silicon material is further thinned in the area where the fully-depleted transistor can be formed by at least one of;

growing a second grown layer of oxide material in the area where the fully-depleted transistor can be formed, where growing the oxide consumes silicon as part of the growth process, and removing the second grown layer of oxide material to reveal the further thinned silicon; and etching the layer of silicon material in the area where the fully-depleted transistor can be formed to further thin the layer of silicon material.

18. The method of claim 17, wherein the layer of silicon material is thinned down to a thickness of between around 800 Angstroms and around 1000 Angstroms, and wherein the layer of silicon is further thinned down to a thickness of between around 50 Angstroms and around 200 Angstroms in the area where the fully-depleted transistor can be formed.

19. The method of claim 13, further comprising forming the insulation material over the area where the partially-depleted transistor can be formed and over the area where the fully-depleted transistor can be formed wherein, in cross section, the insulation material surrounds the oxidation inhibitor layer.

20. The method of claim 19, further comprising removing the oxidation inhibitor from over the area where the fully-depleted transistor can be formed and leaving the oxidation inhibitor over the area where the partially-depleted transistor can be formed.

21. The method of claim 20 further comprising oxidizing the layer of silicon where the fully-depleted transistor can be formed, wherein the oxidation inhibitor inhibits oxidation of the layer of silicon where the partially-depleted transistor can be formed.

* * * * *